US008963249B1

(12) United States Patent
Shifren et al.

(10) Patent No.: US 8,963,249 B1
(45) Date of Patent: Feb. 24, 2015

(54) ELECTRONIC DEVICE WITH CONTROLLED THRESHOLD VOLTAGE

(71) Applicants: Lucian Shifren, San Jose, CA (US); Pushkar Ranade, Los Gatos, CA (US)

(72) Inventors: Lucian Shifren, San Jose, CA (US); Pushkar Ranade, Los Gatos, CA (US)

(73) Assignee: Suvolta, Inc., Los Gatos, CA (US)

( * ) Notice: Subject to any disclaimer, the term of this patent is extended or adjusted under 35 U.S.C. 154(b) by 0 days.

(21) Appl. No.: 14/292,806

(22) Filed: May 30, 2014

Related U.S. Application Data

(63) Continuation of application No. 13/559,554, filed on Jul. 26, 2012, now Pat. No. 8,748,986.

(60) Provisional application No. 61/515,781, filed on Aug. 5, 2011.

(51) Int. Cl.
| | |
|---|---|
| *H01L 27/01* | (2006.01) |
| *H01L 27/12* | (2006.01) |
| *H01L 29/76* | (2006.01) |
| *H01L 29/94* | (2006.01) |
| *H01L 31/0392* | (2006.01) |
| *H01L 31/062* | (2012.01) |
| *H01L 31/113* | (2006.01) |

(Continued)

(52) U.S. Cl.
CPC .................................. *H01L 29/786* (2013.01)
USPC .... 257/348; 257/384; 257/402; 257/E21.409; 257/E27.06

(58) Field of Classification Search
CPC ..................................................... H01L 29/786
USPC ............. 257/348, 384, 402, E21.409, E27.06
See application file for complete search history.

(56) References Cited

U.S. PATENT DOCUMENTS

| 3,958,266 A | 5/1976 | Athanas |
| 4,000,504 A | 12/1976 | Berger |

(Continued)

FOREIGN PATENT DOCUMENTS

| EP | 0274278 A1 | 7/1988 |
| EP | 0312237 A2 | 4/1989 |

(Continued)

OTHER PUBLICATIONS

Banerjee et al., "Compensating Non-Optical Effects using Electrically-Driven Optical Proximity Correction", Proc. of SPIE, vol. 7275, 2009.

(Continued)

*Primary Examiner* — David S Blum

(57) ABSTRACT

A field effect transistor having a source, drain, and a gate can include a semiconductor substrate, a buried insulator layer positioned on the semiconductor substrate, and a semiconductor overlayer positioned on the buried insulator layer; a low dopant channel region positioned below the gate and between the source and the drain and in an upper portion of the semiconductor overlayer; and a plurality of doped regions having a predetermined dopant concentration profile, including a screening region positioned in the semiconductor overlayer below the low dopant channel region, the screening region extending toward the buried insulator layer, and a threshold voltage set region positioned between the screening region and the low dopant channel, the screening region and the threshold voltage set region having each a peak dopant concentration, the threshold voltage region peak dopant concentration being between $1/50$ and $1/2$ of the peak dopant concentration of the screening region.

15 Claims, 7 Drawing Sheets

(51) Int. Cl.
*H01L 31/119* (2006.01)
*H01L 29/786* (2006.01)

(56) References Cited

U.S. PATENT DOCUMENTS

| | | | |
|---|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata et al. |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |

(56) References Cited

U.S. PATENT DOCUMENTS

| | | |
|---|---|---|
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawae et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |

(56) References Cited

U.S. PATENT DOCUMENTS

| | | |
|---|---|---|
| 7,759,206 B2 | 7/2010 | Luo et al. |
| 7,759,714 B2 | 7/2010 | Itoh et al. |
| 7,761,820 B2 | 7/2010 | Berger et al. |
| 7,781,800 B2 | 8/2010 | Chen et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0042841 A1 | 2/2005 | Boyd et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0135924 A1 | 6/2008 | Lebby et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311834 A1 | 12/2009 | Fenouillet-Beranger et al. |
| 2009/0311836 A1 | 12/2009 | Cartier et al. |
| 2009/0311837 A1 | 12/2009 | Kapoor |

(56) References Cited

U.S. PATENT DOCUMENTS

| | | | |
|---|---|---|---|
| 2009/0321849 | A1 | 12/2009 | Miyamura et al. |
| 2010/0012988 | A1 | 1/2010 | Yang et al. |
| 2010/0038724 | A1 | 2/2010 | Anderson et al. |
| 2010/0100856 | A1 | 4/2010 | Mittal |
| 2010/0148153 | A1 | 6/2010 | Hudait et al. |
| 2010/0149854 | A1 | 6/2010 | Vora |
| 2010/0187641 | A1 | 7/2010 | Zhu et al. |
| 2010/0207182 | A1 | 8/2010 | Paschal |
| 2010/0270600 | A1 | 10/2010 | Inukai et al. |
| 2011/0059588 | A1 | 3/2011 | Kang |
| 2011/0073961 | A1 | 3/2011 | Dennard et al. |
| 2011/0074498 | A1 | 3/2011 | Thompson et al. |
| 2011/0079860 | A1 | 4/2011 | Verhulst |
| 2011/0079861 | A1 | 4/2011 | Shifren et al. |
| 2011/0095811 | A1 | 4/2011 | Chi et al. |
| 2011/0121404 | A1 | 5/2011 | Shifren et al. |
| 2011/0147828 | A1 | 6/2011 | Murthy et al. |
| 2011/0169082 | A1 | 7/2011 | Zhu et al. |
| 2011/0175170 | A1 | 7/2011 | Wang et al. |
| 2011/0180880 | A1 | 7/2011 | Chudzik et al. |
| 2011/0193164 | A1 | 8/2011 | Zhu |
| 2011/0212590 | A1 | 9/2011 | Wu et al. |
| 2011/0230039 | A1 | 9/2011 | Mowry et al. |
| 2011/0242921 | A1 | 10/2011 | Tran et al. |
| 2011/0248352 | A1 | 10/2011 | Shifren et al. |
| 2011/0294278 | A1 | 12/2011 | Eguchi et al. |
| 2011/0309447 | A1 | 12/2011 | Arghavani et al. |
| 2012/0021594 | A1 | 1/2012 | Gurtej et al. |
| 2012/0034745 | A1 | 2/2012 | Colombeau et al. |
| 2012/0056275 | A1 | 3/2012 | Cai et al. |
| 2012/0065920 | A1 | 3/2012 | Nagumo et al. |
| 2012/0108050 | A1 | 5/2012 | Chen et al. |
| 2012/0132998 | A1 | 5/2012 | Kwon et al. |
| 2012/0138953 | A1 | 6/2012 | Cai et al. |
| 2012/0146155 | A1 | 6/2012 | Hoentschel et al. |
| 2012/0167025 | A1 | 6/2012 | Gillespie et al. |
| 2012/0187491 | A1 | 7/2012 | Zhu et al. |
| 2012/0190177 | A1 | 7/2012 | Kim et al. |
| 2012/0223363 | A1 | 9/2012 | Kronholz et al. |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Cheng et al., "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shag et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Lavéant, P. "Incorporation, Diffusion and Agglomeration of Carbon in Silicon", 2002, Solid State Phenomena, vols. 82-84, pp. 189-194.

Noda, K et al., "A 0.1-μm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18-μm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378 -1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999, Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, S et al., "MOS Scaling: Transistor Challenges for the 21st Century", 1998, Intel Technology Journal Q3' 1998, pp. 1-19.

Wann, C. et al., "Channel Profile Optimization and Device Design for Low-Power High-Performance Dynamic-Threshold MOSFET", 1996, IEDM 96, pp. 113-116.

English Abstract of JP2004087671 submitted herewith.
English Abstract of JP4186774 submitted herewith.
English Abstract of JP59193066 submitted herewith.
English Abstract of JP8153873 submitted herewith.
English Abstract of JP8288508 submitted herewith.
English Translation of JP8288508 submitted herewith.

(56) References Cited

OTHER PUBLICATIONS

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93.

Machine Translation of KR 10-0794094 Submitted herewith.

Werner, P et al., "Carbon Diffusion in Silicon", Oct. 1998, Applied Physics Letters, vol. 73, No. 17, pp. 2465-2467.

Yan, Ran-Hong et al., "Scaling the Si MOSFET: From Bulk to SOI to Bulk", Jul. 1992, IEEE Transactions on Electron Devices, vol. 39, No. 7.

Wong, H et al., "Nanoscale CMOS", Apr. 1999, Proceedings of the IEEE, vol. 87, No. 4, pp. 537-570.

ELECTRONIC DEVICE WITH CONTROLLED THRESHOLD VOLTAGE

CROSS-REFERENCE TO RELATED APPLICATIONS

This non-provisional application is a continuation of U.S. Nonprovisional application Ser. No. 13/559,554, now U.S. Pat. No. 8,748,986, filed on Jul. 26, 2012, which claims the benefit of U.S. Provisional Application 61/515,781, entitled, "Electronic Device with Controlled Threshold Voltage", filed on Aug. 5, 2011, the entireties of which are hereby incorporated by reference.

BACKGROUND

MOSFETs fabricated with conventional silicon-on-insulator (SOI) technology include partially depleted MOSFETs and fully depleted MOSFETs. For partially depleted MOSFETs (PDSOI), the silicon overlayer is thicker than the depth of the depletion region such that the depletion region only extends partially through the silicon overlayer. On the other hand fully depleted SOI MOSFETs (FDSOI) have a thin silicon overlayer, such that the depletion zone substantially extends through the entire depth of the silicon overlayer. In conventional SOI MOSFETs (PDSOI and FDSOI) a threshold voltage of the MOSFET is adjusted using halo implants in the channel (near the source and drain), and threshold voltage implants in the channel.

A key setting for an SOI MOSFET is the threshold voltage, which in turn determines the voltage at which a transistor can be switched. Low threshold voltage devices switch faster and they are generally used for high speed circuits, but they have higher static leakage power. High threshold voltage devices have lower static leakage power and they are generally used for low speed circuits. Typically, a range of threshold voltage settings is used in an integrated circuit device depending on the design parameters and desired characteristics for a particular circuit block. It is generally known that variation in threshold voltage from the specification for the device is undesirable. In conventional SOI MOSFETs (both PDSOI and FDSOI), threshold voltage is typically adjusted by incorporating dopants into the transistor channel, either by way of direct channel implantation adjacent the gate oxide or by way of pocket or halo implants adjacent the source and drain. Threshold voltage variation can arise because of random dopant fluctuations in the implanted channel area. The variation problem worsens as critical dimensions shrink because of the greater impact of dopant fluctuations as the affected volume of the channel becomes smaller.

DETAILED DESCRIPTION

Figure 1:
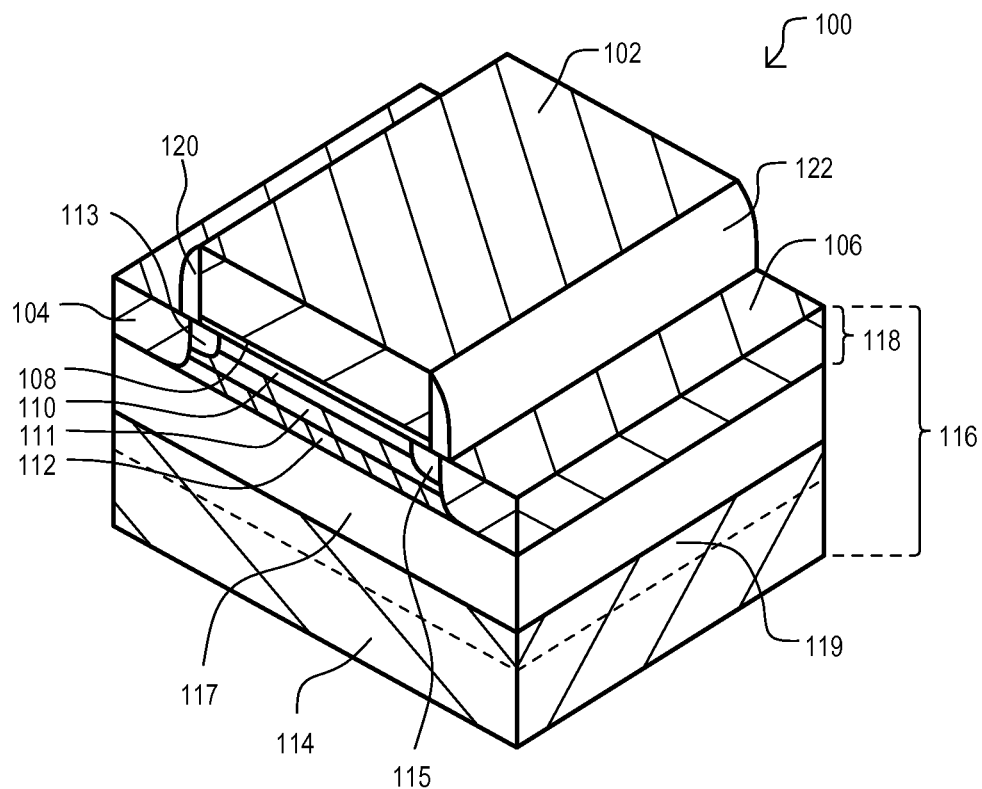
FIG. 1 is a perspective view of an SOI transistor formed on an SOI substrate having a single buried insulator layer (a single BOX SOI substrate) according to an embodiment.
Figure 2:
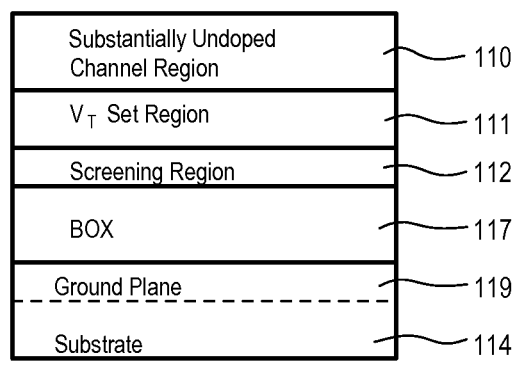
FIG. 2 is a side cross sectional view of the SOI transistor formed on a single BOX SOI substrate according to an embodiment.

Improved semiconductor-on-insulator transistors (referred to hereinafter as "improved SOI transistors") having improved threshold voltage variation and therefore allowing for scaling of voltage are disclosed. Embodiments of structures and fabrication methods are provided that can allow for any of: reliable setting of threshold voltage, improved mobility, transconductance, drive current, strong body effect and reduced junction capacitance. More specifically, embodiments are disclosed having doping profiles that can result in different Vt targets for the different SOI transistor device types without the use of pocket or halo implants or channel implantation adjacent the gate dielectric. FIG. 1 is a perspective view of an improved SOI transistor 100 having improved threshold voltage control, in accordance with one embodiment. FIG. 2 is a side cross sectional view of the improved SOI transistor 100. The improved SOI transistor 100 includes a gate electrode 102, source 104, drain 106, and a gate dielectric 108 positioned over a substantially undoped channel 110. Lightly doped source and drain extensions (LDD) 113 and 115, positioned respectively adjacent to source 104 and drain 106, extend toward each other, setting the transistor channel length.

Referring to FIG. 1, the SOI substrate 116 includes a bulk substrate, which in particular embodiments, can be a bulk silicon substrate 114, a buried insulator layer 117, and a semiconductor overlayer, which in particular embodiments can be a silicon overlayer 118 separated from the silicon substrate 114 by the buried insulator layer 117. The SOI substrate can be fabricated by any suitable technique such as Separation by the Implantation of Oxygen (SIMOX), Bonded SOI, or Smart Cut. The buried insulator layer 117 can be a conventional dielectric material, such as silicon dioxide ($SiO_2$), and can have a thickness in the range of 50 nanometers to 150 nanometers, but is not so limited. In certain embodiments the silicon overlayer 118 can be as thin as 10 nanometers or less, but in alternative embodiments the silicon overlayer 118 can be as thick as 150 nanometers, but is not so limited.

The improved SOI transistor 100 (FIG. 1) is shown as an N-channel transistor having a source 104 and drain 106 made of N-type dopant material, formed upon a substrate 116. In addition, the improved N-channel SOI transistor 100 includes a highly doped screening region 112 made of P-type dopant material, and a threshold voltage set region 111 made of P-type dopant material. Substantially undoped channel 110 is preferably formed using epitaxially-grown silicon, using a process recipe that is intended to result in undoped crystalline silicon. Although substantially undoped channel 110 may be referred to herein as the "undoped channel", it is understood that a minimum or baseline level of dopants are present due to unavoidable introduction of some foreign material during the otherwise intrinsic epitaxial process. As a general matter, the "undoped channel" preferably has a dopant concentration of less than $5 \times 10^{17}$ atoms/cm$^3$. However, it will be understood that, with appropriate change to substrate or dopant material, an improved P-channel SOI transistor can be formed from suitable substrates.

The features of the improved SOI transistor 100 can result in various transistor device types. Such transistor device types include, but are not limited to: P-FETs, N-FETs, FETs tailored for digital or analog circuit applications, high-voltage FETs, high/normal/low frequency FETs, FETs optimized to work at distinct voltages or voltage ranges, low/high power FETs, and low, regular, or high threshold voltage transistors (i.e., low Vt, regular Vt, or high Vt—also referred to as LVt, RVt, or HVt, respectively), etc. Transistor device types are usually distinguished by electrical characteristics (e.g., threshold voltage, mobility, transconductance, linearity, noise, power), which in turn can lend themselves to be suitable for a particular application (e.g., signal processing or data storage). Since a complex integrated circuit such as, for instance, a system on a chip (SoC) may include many different circuit blocks having different transistor device types to achieve the desired circuit performance, it is desirable to use a transistor structure that can be readily fabricated to result in the various transistor device types.

A process for forming the improved SOI transistor may begin with forming the screening region 112 in the silicon overlayer 118. In certain embodiments, the screening region 112 is formed by implanting screening region dopant material in the silicon overlayer 118. Other methods may be used to form the screening region, such as in-situ doped epitaxial silicon deposition, or epitaxial silicon deposition followed by vertically directed dopant implantation to result in a heavily doped region embedded a vertical distance downward from gate 102. Preferably, the screening region is positioned such that the top surface of the screening region is located approximately at a distance of Lg/1.5 to Lg/5 below the gate (where Lg is the gate length). The screening region is preferably formed before STI (shallow trench isolation) formation. However, in alternative embodiments the screening region formation step can be performed after STI (shallow trench isolation) formation, depending on the application and results desired. Boron (B), Indium (I), or other P-type materials may be used for P-type NMOS screening region implants, and arsenic (As), antimony (Sb) or phosphorous (P) and other N-type materials can be used for N-type PMOS screening region implants. The screening region 112 is considered heavily doped, has a significant dopant concentration, which may range between about $5 \times 10^{18}$ to $5 \times 10^{20}$ dopant atoms/cm$^3$. Generally, if the screening region 112 dopant level is on the higher end of the range, the screening region 112 can simultaneously function as the threshold voltage setting region.

Though exceptions may apply, as a general matter it is desirable to take measures to inhibit the upward migration of dopants from the screening region, and in any event, controlling the degree to which dopants may migrate upward as a mechanism for controlling the threshold voltage setting is desired. All process steps occurring after the placement of screening region dopants are preferably performed within a selected thermal budget that limits the upward migration of dopants into the substantially undoped channel region 110. Moreover, for those dopants that tend to migrate or for flexibility in using a higher temperature in subsequent processes, a germanium (Ge), carbon (C), or other dopant migration resistant layer can be incorporated above the screening region to reduce upward migration of dopants. The dopant migration resistant layer can be formed by way of ion implantation, in-situ doped epitaxial growth or other processes. In one embodiment, the dopant migration control species is incorporated into the screening region to reduce the migration of screening region dopants, e.g., by forming the screening region as an in-situ doped epitaxial layer that is doped in-situ with C and the screening region dopants species.

A threshold voltage set region 111 is usually positioned above the screening region 112. The threshold voltage set region 111 can be either adjacent to, incorporated within or vertically offset from the screening region. In certain embodiments, the threshold voltage set region 111 is formed by implanting into the screening region 112, delta doping, controlled in-situ deposition, or atomic layer deposition. In alternative embodiments, the threshold voltage set region 111 can be formed by way of controlled outdiffusion of dopant material from the screening region 112 into an undoped epitaxial layer using a predetermined thermal cycling recipe. Preferably, the threshold voltage set region 111 is formed before the undoped epitaxial layer is formed, though exceptions may apply. The threshold voltage is designed by targeting a dopant concentration and thickness of the threshold voltage set region 111 suitable to achieve the threshold voltage desired for the device. Note that if the screening region 112 concentration is sufficiently high, then the screening region 112 can function as the threshold voltage setting region and a separate threshold voltage setting region is not needed. Preferably, the threshold voltage set region 111 is fabricated to be a defined distance below gate dielectric 108, leaving a substantially undoped channel layer directly adjacent to the gate dielectric 108. The dopant concentration for the threshold voltage set region 111 depends on the desired threshold voltage for the device taking into account the location of the threshold voltage set region 111 relative to the gate. Preferably, the threshold voltage set region 111 has a dopant concentration between about $1 \times 10^{18}$ dopant atoms/cm$^3$ and about $1 \times 10^{19}$ dopant atoms per cm$^3$. Alternatively, the threshold voltage set region 111 can be designed to have a dopant concentration that is approximately one third to one half of the concentration of dopants in the screening region 112.

The substantially undoped channel region 110 is formed preferably by way of a blanket epitaxial silicon deposition, although selective epitaxial deposition may be used. The channel 110 is structured above the screening region 112 and threshold voltage set region 111, having a selected thickness tailored to the electrical specifications of the device. The thickness of the substantially undoped channel region 110 usually ranges from approximately 5-25 nm, where a thicker undoped channel region 110 is usually used for a lower Vt device. To achieve the desired undoped channel region 110 thickness, a thermal cycle may be used to cause an outdiffusion of dopants from the screening region 112 into a portion of the deposited epitaxial layer to result in a threshold voltage setting region 111 for a given undoped channel region 110 thickness. To control the degree of outdiffusion of dopants across a variety of device types, dopant migration resistant layers of C, Ge, or the like can be applied above the threshold voltage set region 111, below the threshold voltage set region 111, and/or dopant migration control species such as C or Ge can be incorporated into the threshold voltage set region 111. Isolation structures are preferably formed after the channel region 110 is formed, but may also be formed beforehand in certain embodiments, particularly if selective epitaxy is used to form the channel region.

In addition to using dopant migration resistant layers, other techniques can be used to reduce upward migration of dopants from the screening region 112 and the threshold voltage set region 111, including but not limited to low temperature processing, selection or substitution of low migration dopants such as antimony or indium, low temperature or flash annealing to reduce interstitial dopant migration, or any other suitable technique to reduce movement of dopant atoms can be used.

The improved SOI transistor 100 can be completed by forming a gate electrode 102 which may be a polysilicon gate or a metal gate, as well as LDDs 113 and 115, spacers 120 and 122, and source 104 and drain 106 structures using conventional fabrication methods, with the caveat that the thermal budget be maintained within a selected constraint to avoid unwanted migration of dopants from the previously formed screening region 112 and threshold voltage setting region 111. For embodiments of the improved SOI transistor 100, when gate electrode voltage is applied at a predetermined level, a depletion region formed in the substantially undoped channel 110 can substantially extend to the screening region 112, since channel depletion depth is a function of the integrated charge from dopants in the doped channel lattice, and the substantially undoped channel 110 has very few dopants. In certain embodiments, at least part of the depletion region extends from the gate dielectric through the substantially undoped channel 110 and a short distance into the highly doped screening region 112 when the predetermined voltage is applied to the gate.

In a conventional SOI transistor, the threshold voltage is typically set by directly implanting a "threshold voltage implant" into the channel, raising the threshold voltage to an acceptable level that reduces transistor off-state leakage while still allowing high switching speeds. The threshold voltage implant generally results in dopants permeating through the entire channel region. Alternatively, the threshold voltage ($V_t$) in conventional SOI transistors can also be set by a technique variously known as "halo" implants, high angle implants, or pocket implants. Such implants create a localized, graded dopant distribution near a transistor source and drain that extends a distance into the channel. Both halo implants and channel implants introduce dopants into the channel, resulting in random fluctuations of dopants in the channel which in turn can affect the actual threshold voltage for the device. Such conventional threshold voltage setting methods result in undesirable threshold voltage variability between transistors and within transistor arrays. Additionally, such conventional threshold voltage setting methods decrease mobility and channel transconductance for the device.

The use of halo implants also typically introduces additional process steps, thereby increasing the manufacturing cost. In a typical manufacturing flow, halo implants generally require at least two separate processing steps with the die wafer being rotated between different positions (e.g. 0, 90, 180, or 270 degrees), and die with multiple transistor types can even require multiple separate halo implants. Since advanced die manufacturing processes currently require dozens of high angle implants, eliminating or greatly reducing the number of halo implants is desirable for reducing manufacture time and simplifying die processing. The use of halo implants also introduces an additional source of threshold voltage variation for transistors having poly gate structures because at least a portion of the halo implant can travel through the corner of the poly gate. Since poly gate sidewall shape and crystal structure affect final location of halo dopants in the channel, unavoidable variation in poly gate edge shape and poly gate crystal structure can result in further variations in threshold voltage. Such transistor variation is undesirable as it can reduce performance of a circuit, and is of particular concern for paired analog transistors that rely on close matching of transistor characteristics for best performance.

By contrast, the techniques for forming the improved SOI transistor 100 use different threshold voltage modification techniques that do not rely on halo implants (i.e., haloless processing) to set the threshold voltage to a desired value. The techniques for forming the improved SOI transistor also maintain a substantially undoped channel near the gate, unlike the conventional process for setting the threshold voltage that involves a shallow implant just below the gate. This can advantageously reduce cost of manufacture because halo implant process steps are not required, reduces the chance of failure due to misaligned halo implants, and can eliminate unwanted contamination of the undoped channel.

The threshold voltage of the improved SOI transistor 100 can be set by controlling the dopant concentration and position of the threshold voltage set region 111, while leaving the bulk of the channel region 110 substantially undoped. As will also be appreciated, position, concentration, and thickness of the screening region 112 are an important factor in the design of the improved SOI transistor. The screening region 112 placement and dopant concentration, together with the threshold voltage set region 111 effect the threshold voltage for the device. The peak concentration of the screening region generally pins the depletion layer under the gate. Preferably, the screening region is located above the bottom of the source and drain junctions or below the horizontal bottom of the source and drain regions. Multiple delta doping implants, broad dopant implants, or long duration in-situ substitutional doping is preferred, since the screening region 112 should have a finite thickness, with 10 nm or greater being preferred. When transistors are configured to have such screening regions, the transistor can simultaneously have good threshold voltage matching, high output resistance, low junction leakage, good short channel effects, and still have an independently controlled and strong body effect. In addition, improved SOI transistors can be used to provide multiple transistors having different threshold voltages on the same die by controlling the position and dopant concentration of the threshold voltage set region 111 and/or the screening region 112, and by controlling the thickness of the substantially undoped channel region 110. Simultaneous provision of these features can be difficult for conventional transistors of a similar size. In contrast, improved SOI transistors designed to have a substantially undoped channel, optional threshold voltage set region (as discussed hereafter), and a thick and highly doped screening region can simultaneously provide all, or substantially all of the transistor device parameters required for implementation of complex multi-transistor SOC or multi-transistor analog integrated circuits. The ultimate positioning, thickness, dopant concentration of the screening region and the threshold voltage set region can be based upon an optimization of the channel relative to desired specifications such as short channel effects, performance, and leakage.

Setting threshold voltage by use of a threshold voltage set region 111 positioned above the screening region 112 and below the substantially undoped channel 110 is an alternative technique to conventional threshold voltage implants for adjusting threshold voltage. Care must be taken to prevent dopant migration into the substantially undoped channel 110, by various methods including maintaining all process steps within a thermal budget, as well as using dopant migration inhibitor materials in the crystalline lattice. The threshold voltage set region thickness typically ranges from 2 to 20 nanometers. The threshold voltage set region 111 is highly doped relative to the substantially undoped channel 110, but is typically doped to a level one-half to one-tenth that of the screening region 112. However, embodiments in which the threshold voltage set region has a complex dopant profile are also contemplated. Like the screening region, in certain embodiments, dopant migration resistant layers of carbon, germanium, or the like can be applied along with or above the threshold voltage set region to prevent dopant migration into the substantially undoped channel. The threshold voltage set region 111 can be formed by a controlled out-diffusion from the screening region 112 into an epitaxially grown layer, by ion implantation above the screening region 112 or in-situ doped epitaxial layer grown on top of the screening region 112, by delta doping to form an offset doped plane (as disclosed in pending US Patent Publication No. US 2011/0079861 A1, having application Ser. No. 12/895,785 filed Sep. 30, 2010, the entirety of which disclosure is herein incorporated by reference), or any other conventional or known doping techniques amenable for forming a doped region of the desired concentration of dopants, width and position relative to the bottom of the gate.

Another impact to the threshold voltage of the device is based upon the selection of a gate material having a suitable work function. The gate electrode 102 can be formed from conventional materials, preferably including, but not limited to, metals, metal alloys, metal nitrides and metal silicides, as well as laminates thereof and composites thereof. In certain embodiments the gate electrode 102 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods and physical vapor deposition methods, such as, but not limited to, evaporative methods and sputtering methods. Typically, the gate electrode 102 has an overall thickness from about 1 to about 500 nanometers. In certain embodiments, metals having a work functions intermediate between band edge and mid-gap can be selected. As discussed in U.S. Pat. No. 8,569,128 B2, issued on Oct. 29, 2013, the entirety of which disclosure is herein incorporated by reference, such metal gates simplify swapping of PMOS and NMOS gate metals to allow a reduction in mask steps and different required metal types for systems on a chip or other die supporting multiple transistor types.

The device channel includes lightly doped drain extensions (LDD) 113 and 115, source/drain extensions that are typically formed by light ion implantation or out-diffusion under gate spacers. Source/drain extensions slightly reduce channel length by extending the source/drain toward each other using dopant implants of the same dopant type as the source and drain. Care must be taken to control against dopant migration from the LDD region to keep the channel area substantially undoped, with a dopant concentration of less than $5 \times 10^{17}$ dopant atoms per $cm^3$. As will be appreciated, variations in extension dimensions affect channel electrical characteristics, which in turn can lead to unwanted adjustments to threshold voltage. As shown in FIGS. 1 and 2, the LDD 113 and 115 are symmetrically spaced and extending toward each other with a predetermined length that can be optionally increased or decreased depending on the design of the device. In other embodiments, asymmetrical LDD's are possible, with, for example, LDD 115 being configured to extend a greater or lesser extent into the channel than LDD 113, having a greater or lesser dopant density than LDD 113, or extending deeper downward or shallower than LDD 113.

Applied bias to the screening region 112 is yet another technique for modifying threshold voltage of the improved SOI transistor 100. The screening region 112 sets the body effect for the transistor and allows for a higher body effect than is found in conventional SOI technologies. For example, a body tap (not shown) to the screening region 112 of the improved SOI transistor can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point, or dynamic, to adjust to changes in transistor operating conditions or requirements. Various suitable biasing techniques are disclosed in U.S. Pat. No. 8,273,617 B2, issued on Sep. 25, 2012, the entirety of which disclosure is herein incorporated by reference.

One embodiment of the improved SOI transistor 100 can also include a ground plane 119 that can be positioned below the buried insulator layer 117. The ground plane can be doped at a concentration of $1 \times 10^{19}$ atoms/$cm^3$ or less. The ground plane can be used to reduce drain induced barrier lowering (DIBL) in the improved SOI transistor.

FIG. 2 illustrates the different regions and layers in the improved SOI transistor 100. For ease of illustration some of the elements of FIG. 1 are not shown in FIG. 2, e.g., the gate electrode 102, source 104, drain 106, and gate dielectric 108.

Figure 3:
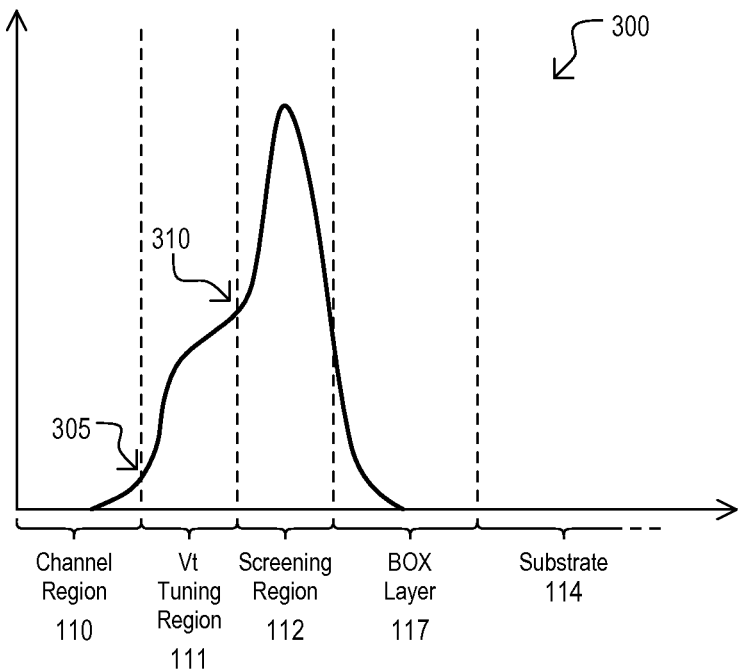
FIGS. 3-7 are graphs illustrating dopant profiles of SOI transistors formed on single BOX SOI substrates, in accordance with certain embodiments.

FIG. 3 is a graph illustrating a dopant concentration profile for an improved SOI transistor 100 in accordance with one embodiment. The graph 300 illustrates ranges of dopant concentration and depth for the different regions in the improved SOI transistor for an embodiment where the channel region is directly below the gate and is characterized by a substantially undoped channel, the threshold voltage set region which is represented as the "Vt Tuning Region" which is adjacent to and directly below the channel region, and the screening region which is adjacent to and directly below the threshold voltage set region as shown in FIG. 3. The graph 300 includes notches 305 and 310 that illustrate the dopant concentration profiles that are targeted for the different layers that define the substantially undoped channel, the threshold voltage set region, and the screening region. The electrical characteristics of the improved SOI transistor can be determined by the location of the notches 305 and 310, and the peak dopant concentration in the threshold voltage set region 111 and the screening region 112. In one embodiment, peak dopant concentration of the dopant profile can be positioned in the screening region, and the threshold voltage set region dopant concentration can be in a range that is between 1/50 to 1/2 of the screening region peak dopant concentration. In one embodiment, the channel region is of approximately 5 nm to 20 nm in thickness, the Vt Tuning Region is of approximately 2 nm to 20 nm in thickness, and the screening region is of approximately 2 nm to 20 nm in thickness. In alternative embodiments, the screening region extends within 5 nm of the buried insulator layer, and the Vt tuning region extends within 30 nm of the buried insulator layer. Manufacturing processes suitable for forming the dopant profile illustrated in the graph 300 are described in U.S. Patent Publication No. 2011/0309447 A1, having application Ser. No. 12/971,955 titled "Transistor with Threshold Voltage Set Notch and Method of Fabrication Thereof," the disclosure of which is hereby incorporated by reference.

Figure 4:
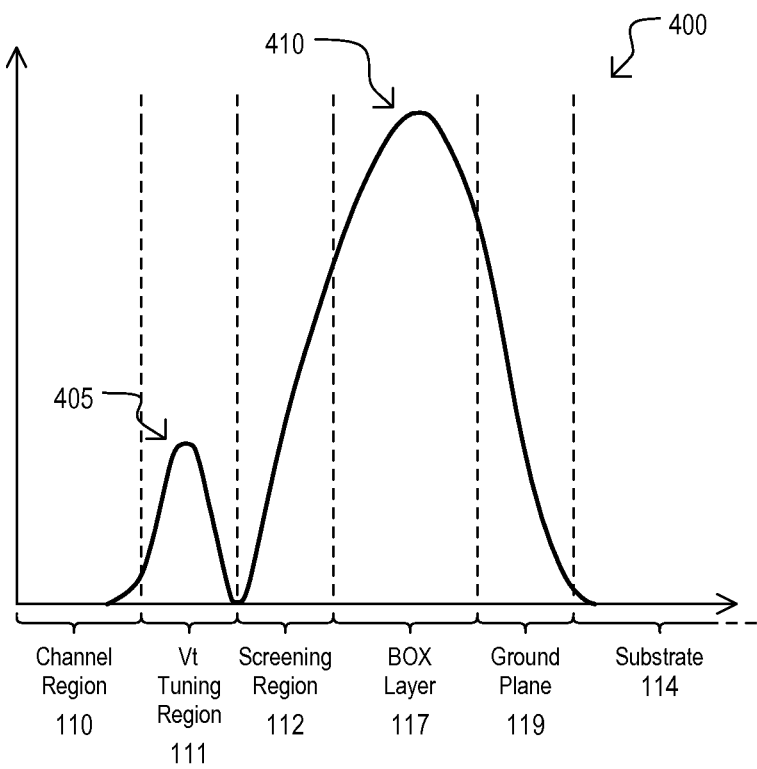

FIG. 4 is a graph illustrating a dopant concentration profile for an improved SOI transistor 100 in accordance with one embodiment. The graph 400 illustrates ranges of dopant concentration and depth for the different regions in the improved SOI transistor having similar regional delineations as that illustrated in FIG. 3 above with the addition of a ground plane 119 doped region below the BOX layer, with the substrate below the ground plane region. The graph 400 includes two peaks 405 and 410 that illustrate the dopant profiles of the different layers that define the substantially undoped channel, the threshold voltage set region, and the screening region. The dopant concentration corresponding to the first peak 405 is lower than the dopant concentration corresponding to the second peak 410. The first peak 405 is positioned in the threshold voltage set region. The second peak 410 is positioned in the buried insulator layer, such that the tails of the dopant profile associated with the second peak correspond to dopant concentration ranges that are sufficient to form a screening region and a ground plane in accordance with the above description of these layers. In one embodiment, the maximum dopant concentration within the ground plane can be substantially equal to the maximum dopant concentration within the screening region. Implanting the dopants such that the doping process results in a concentration of dopants in the ground plane region, as illustrated by the graph 400, can provide improved SOI transistors having a high body coefficient. In certain embodiments the dopant profile of graph 400 can be formed as a result of two implantation steps that form the peak dopant concentration 405 and 410 respectively, effective to set the threshold voltage to the desired value and provide the high body coefficient using a dopant concentration roughly the same level at its peak as the peak concentration in the screening region, all the while maintaining a substantially undoped channel region.

Figure 5A:
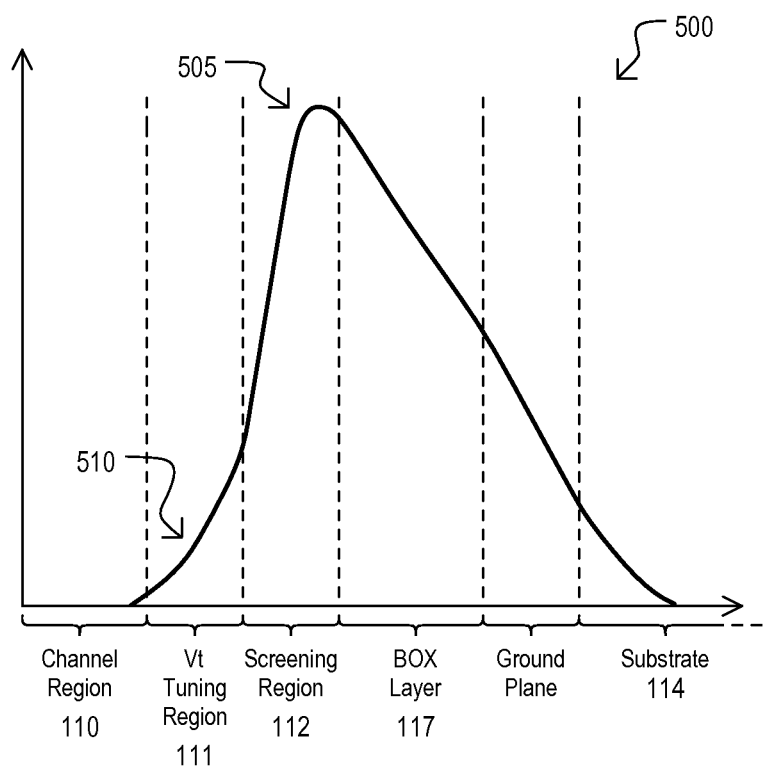

FIG. 5A is a graph illustrating a dopant concentration profile for an improved SOI transistor 100 in accordance with one embodiment. The graph 500 illustrates ranges of dopant concentration and depth below the gate for the different layers in the improved SOI transistor having similar regional delineations as that illustrated in FIG. 4 above. The graph 500 includes one peak 505 that is positioned in the screening region. In this embodiment, the dopants are implanted under implant conditions using a dose sufficient to achieve the peak concentration with an energy level targeted to position the peak to be within the screening region with sufficient energy to permit the dopants to penetrate the buried insulator layer and form a ground plane in the silicon substrate layer. Implanting the dopants through the buried insulator layer 117 so as to form a ground plane, as illustrated by the graph 500, can provide improved SOI transistors having a high body coefficient. In addition, the tail of the dopant profile 510 has dopant concentration ranges that span across the doped regions such that the screening region and the Vt tuning region are effectively combined into one merged doped region situated so as to provide sufficient dopants to set the threshold voltage while maintaining a substantially undoped channel region, with a concentration of dopants within the ground plane region so as to provide a strong body effect for the device. In certain embodiments the peak 505 can be positioned in the screening region such that it is closer to the buried insulator layer, the positioning and peak value of the screening region determining the depletion width for the device. In the embodiment shown, the dopant profile of graph 500 can be asymmetric about the peak 505 such that the maximum dopant concentration range in the threshold voltage set region is lower than the maximum dopant concentration in the ground plane.

Figure 5B:
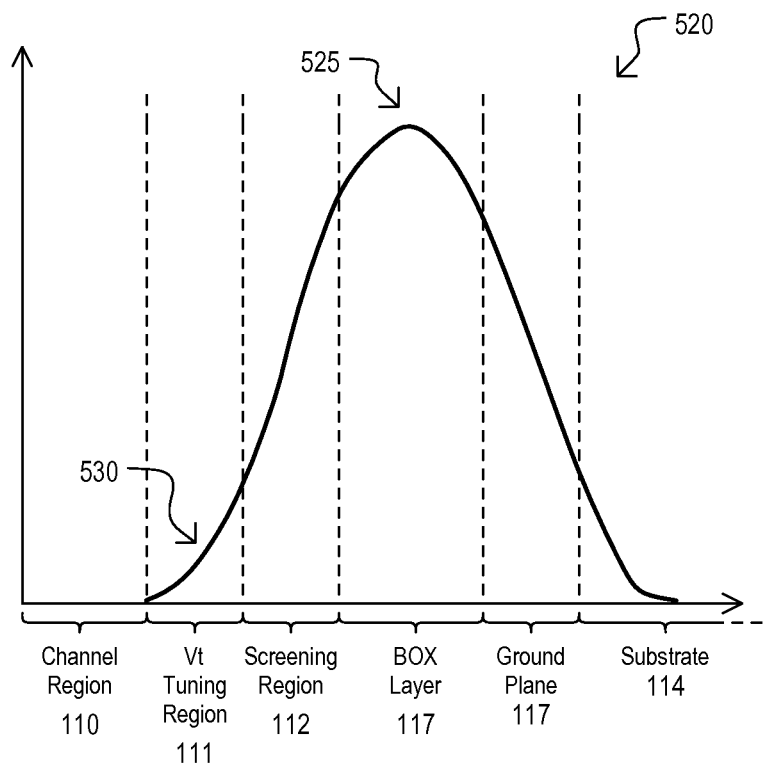

FIG. 5B is a graph illustrating a dopant concentration profile for an improved SOI transistor 100 in accordance with one embodiment. The graph 520 illustrates ranges of dopant concentration and depth below the gate for the different layers in the improved SOI transistor having similar regional delineations as that illustrated in FIG. 4 above. The graph 520 includes one peak 525 that is positioned in the buried insulator layer. In this embodiment, the dopants can be implanted using a single ion implantation process, using a dose sufficient to achieve the peak concentration with an energy level targeted to position the peak within the buried insulator layer and penetrate beyond to form a ground plane in the silicon substrate layer. In addition, the tail of the dopant profile 530 has dopant concentration ranges sufficient to form the screening region and the threshold voltage set region. In one embodiment, the maximum dopant concentration within the ground plane can be substantially equal to the maximum dopant concentration within the screening region.

Figure 5C:
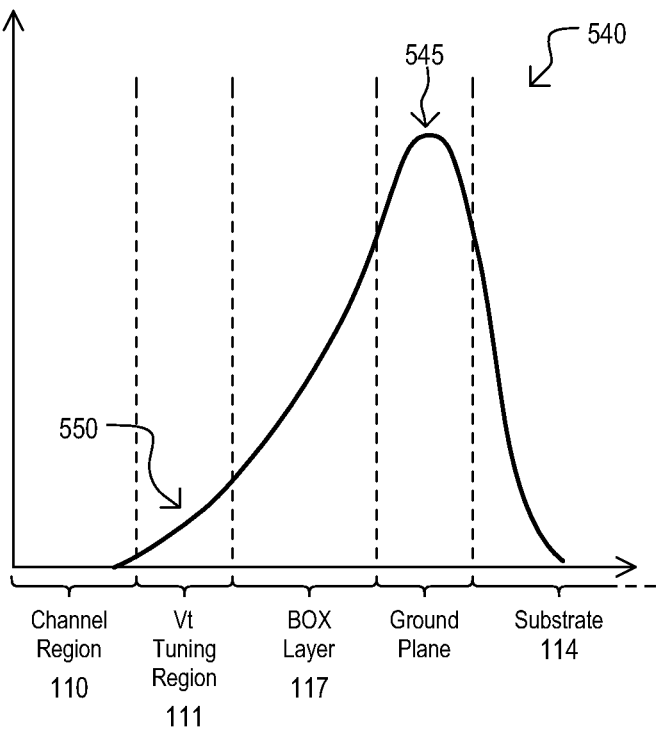

FIG. 5C is a graph illustrating a dopant concentration profile for an improved SOI transistor 100 in accordance with one embodiment. The improved SOI transistor corresponding to this embodiment includes a threshold voltage set region, and a ground plane, but it does not include a screening region. The graph 540 illustrates ranges of dopant concentration and depth below the gate for the different layers in the improved SOI transistor. In this embodiment, the dopants can be implanted using a single ion implantation process, using a dose sufficient to achieve the peak concentration with an energy level targeted to position the peak within the ground plane region. In this embodiment, the tail of the dopant profile 550 has a dopant concentration range sufficient to set the threshold voltage value, with the high peak concentration portion used for the Ground Plane. In one embodiment, the threshold voltage set region can extend within 30 nm of the buried insulator layer. In one embodiment, the peak dopant concentration can be greater than about $1 \times 10^{19}$ atoms/cm$^3$, and the threshold voltage set region dopant concentration can be in the range of $\frac{1}{50}$ to $\frac{1}{2}$ of the peak dopant concentration. In certain alternative embodiments, the ground plane has at least 80% of the dopants in the predetermined dopant profile, or the threshold voltage set region has less than 20% of the dopants in the predetermined dopant profile.

Figure 6:
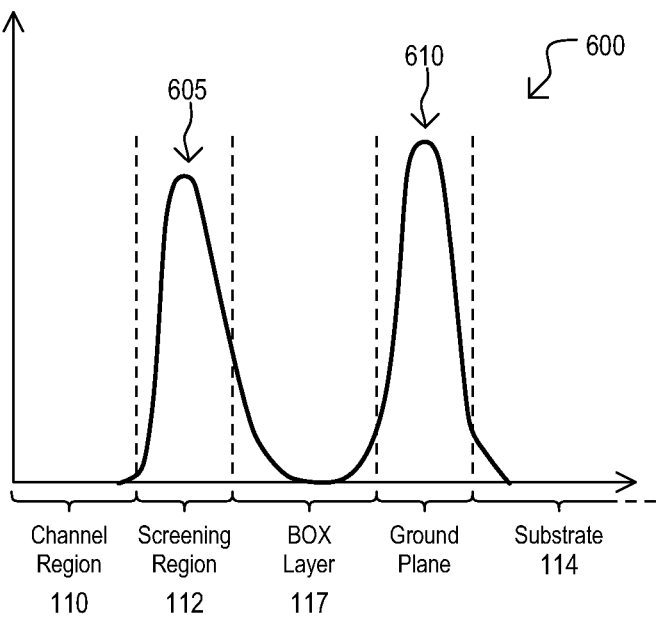

FIG. 6 is a graph illustrating a dopant concentration profile for an improved SOI transistor 100 in accordance with one embodiment. The improved SOI transistor corresponding to this embodiment includes a screening region, and a ground plane, but it does not include a threshold voltage set region. The graph 600 includes two peaks 605 and 610, and illustrates ranges of dopant concentration and depth below the gate for the different layers in the improved SOI transistor. The first peak 605 is positioned in the screening region so as to set the threshold voltage for the device, and the second peak 610, in this embodiment having approximately the same dopant concentration as the screening region, is positioned in the ground plane. In this embodiment, the dopants are implanted using a two ion implantation processes, under implant dose and energy conditions sufficient to permit the dopants to form one peak at 605, and to penetrate the buried insulator layer and form the peak dopant concentration to define a ground plane in the silicon substrate layer below the buried insulator layer.

Figure 7:
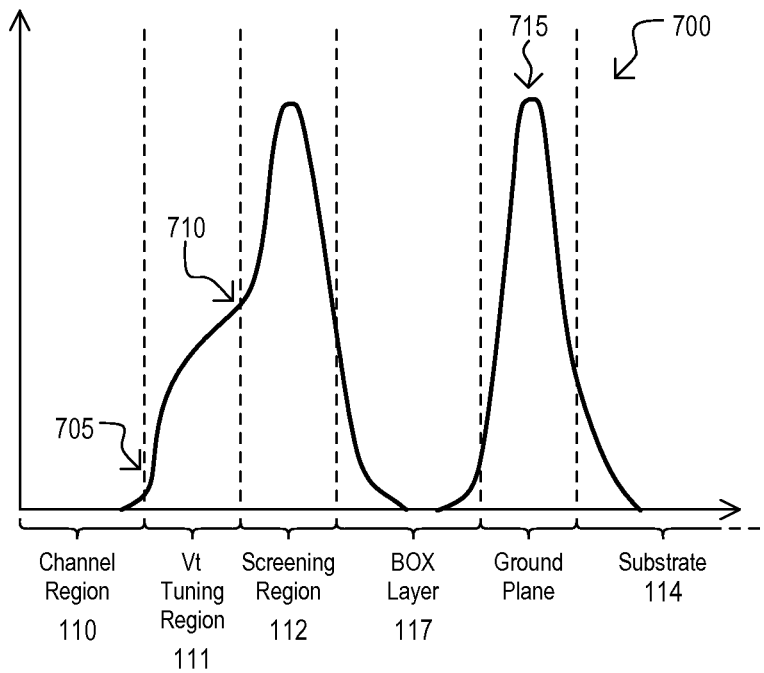

FIG. 7 is a graph illustrating a dopant concentration profile for an improved SOI transistor 100 in accordance with one embodiment. The graph 700 illustrates ranges of dopant concentration and depth below the gate for the different layers in an embodiment of the improved SOI transistor that includes a ground plane, and where the substantially undoped channel, the threshold voltage set region, and the screening region are adjacent to each other as shown in FIG. 7. The graph 700 includes notches 705 and 710 that illustrate the dopant profiles of the different layers that define the substantially undoped channel, the threshold voltage set region, and the screening region. The electrical characteristics of the improved SOI transistor can be determined by the location of the notches 705 and 710. In addition, the graph 700 includes a peak 715 that is positioned under the buried insulator layer to form the ground plane. In this embodiment, the dopants are implanted using a multi-step ion implantation process, under implant dose and energy conditions sufficient to permit the dopants to form one peak between 705 and 710, and another peak within the screening region, and then penetrate the buried insulator layer and form the ground plane in the silicon substrate layer under the buried insulator layer.

Figure 8:
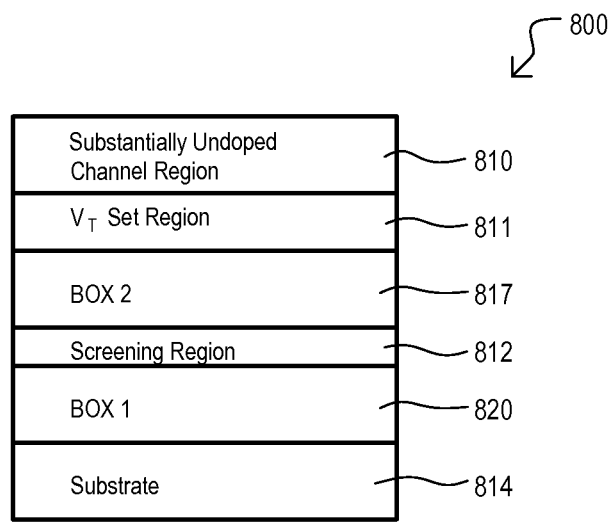
FIG. 8 is a side cross sectional view of an improved SOI transistor formed on an SOI substrate having two buried insulator layers (a dual BOX SOI substrate) according to an embodiment.

An alternative embodiment of the SOI transistor with improved threshold voltage control is illustrated in cross sectional view in FIG. 8. The improved SOI transistor 800 is configured to have reduced noise, improved mobility, and decreased variation in threshold voltage due, in part, to minimization of channel dopants. The improved SOI transistor 800 has various optional and required structures (not shown), including a gate electrode, source, drain, and a gate dielectric that are positioned over a substantially undoped channel 810. Lightly doped drain extensions (LDD) (not shown), can be positioned adjacent to source and drain, extending toward each other, reducing effective length of the substantially undoped channel 810. The alternative embodiment of the improved SOI transistor 800 is formed on a SOI substrate having two buried insulator layers 817 and 820 (a dual BOX SOI substrate), whereas the improved SOI transistor 100 is formed on a SOI substrate having a single buried insulator layer (a single BOX SOI substrate). The improved SOI transistor 800 can be similar to the improved SOI transistor 100 in all other aspects, and the above description of the improved SOI transistor 100 is also applicable to the improved SOI transistor 800. Embodiments of the improved SOI transistor can include a highly doped screening region 812, a threshold voltage set region 811, and a ground plane (not shown). The dual BOX SOI substrate includes a bulk silicon substrate 814, a first buried insulator layer 820, a first silicon overlayer that includes the screening region 812, a second buried insulator layer 817, and a second silicon overlayer that includes the threshold voltage set region 811 and the substantially undoped channel region 810.

Figure 9:
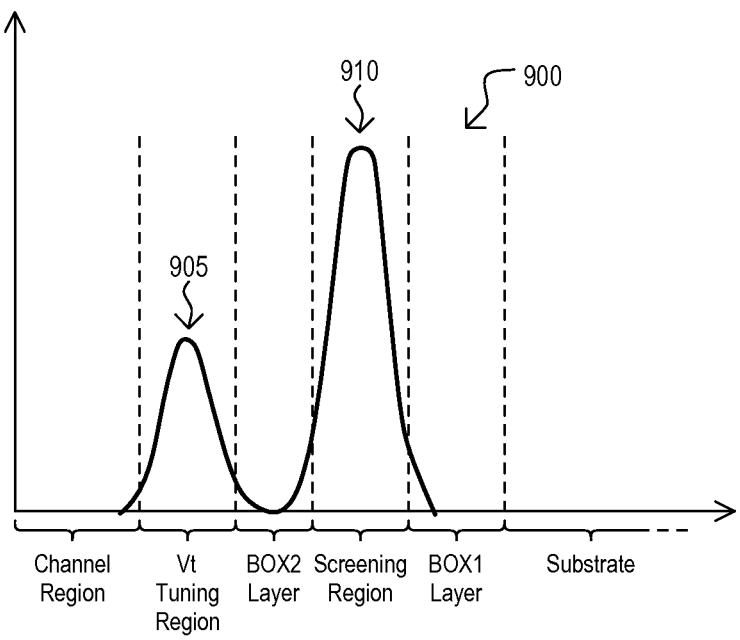
FIGS. 9-10 are graphs illustrating dopant profiles of SOI transistors formed on dual BOX SOI substrates, in accordance with certain embodiments.

FIG. 9 is a graph illustrating a dopant concentration profile for an improved SOI transistor 100 in accordance with one embodiment. The graph 900 illustrates ranges of dopant concentration and depth for the different layers in the improved SOI transistor. The graph 900 includes two peaks 905 and 910 that illustrate the dopant profiles of the different layers that define the substantially undoped channel, the threshold voltage set region, and the screening region. The dopant concentration corresponding to the first peak 905 is lower than the dopant concentration corresponding to the second peak 910. The first peak 905 is positioned in the threshold voltage set region and the second peak 910 is positioned in the screening region such that the concentration of dopants around the first peak 905 forms the threshold voltage set region, and the concentration of dopants around the second peak 910 forms the screening region. The graph 900 illustrates the dopant concentration decaying to low levels in the first buried insulator layer, such that the silicon substrate layer remains substantially undoped and a ground plane is not formed in the silicon substrate layer. In alternative embodiments, the dopant profile associated with the second peak 910 is such that the dopants penetrate through the first buried oxide layer into the silicon substrate layer to form a ground plane. In certain embodiments the dopant profile of graph 900 can be formed as a result of two implantation steps that form the peak dopant concentration 905 and 910 respectively, as well as the adjacent dopant profiles.

Figure 10:
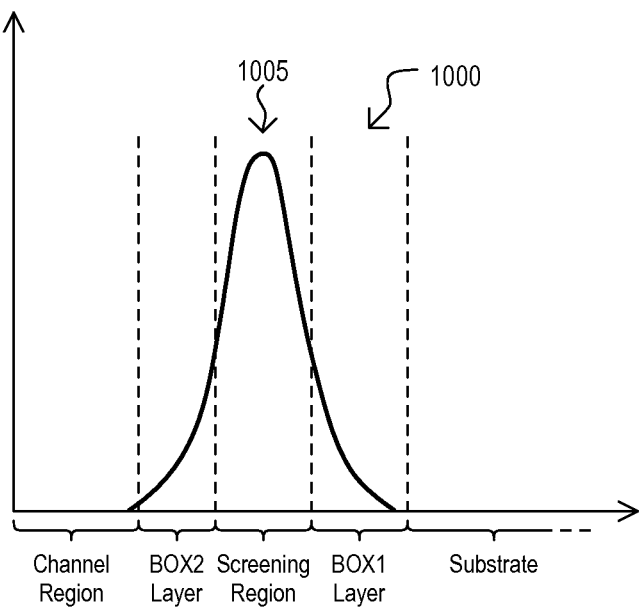

FIG. 10 is a graph illustrating a dopant profile for an improved SOI transistor 100 in accordance with one embodiment. The graph 1000 illustrates ranges of dopant concentration and depth for the different layers in the improved SOI transistor. The graph 1000 includes one peak 1005 that is positioned in the screening region. The graph 1000 illustrates the dopant concentration decaying to low levels in the first and second buried insulator layer such that the silicon overlayer and the silicon substrate layer remain substantially undoped. In this embodiment, the improved SOI transistor has a screening region, and it does not have a threshold voltage set region or a ground plane, with the channel region remaining substantially undoped. In alternative embodiments, the dopant profile does not decay to low levels in the second buried insulator layer, and the resulting dopant profile in the silicon overlayer is sufficient to form a threshold voltage set region and a substantially undoped channel layer. In other embodiments, the dopant profile does not decay to low levels in the first buried insulator layer, and the resulting dopant profile in the silicon substrate layer is sufficient to form a ground plane.

In certain embodiments the blanket undoped epitaxial layer can be deposited or grown over the doped regions to provide the channel region for various channel dopant concentration profiles, extending across multiple die and transistor die blocks. Such a blanket epitaxial layer reduces unwanted upward migration of pre-emplaced dopants. In other embodiments, highly doped screening regions, lightly doped threshold voltage setting regions, or other transistor structures can be formed in or adjacent to the epitaxial layer, allowing adjustment of various transistor characteristics, including threshold voltage and leakage current. Embodiments of various structures and manufacturing processes suitable for use in the applications and processes according to the present disclosure are more completely described in U.S. Pat. No. 8,273,617 B2, issued on Sep. 25, 2012, U.S. Pat. No. 8,530,286 B2, issued on Sep. 10, 2013, U.S. Patent Publication No. 2011/0309447 A1 having application Ser. No. 12/971,955 titled "Transistor with Threshold Voltage Set Notch and Method of Fabrication Thereof", and U.S. Patent Publication No. 2011/0079861 A1 having application Ser. No. 12/895,785 titled "Advanced Transistors With Threshold Voltage Set Dopant Structures", the disclosures of which are hereby incorporated by reference in their entirety.

Figure 11:
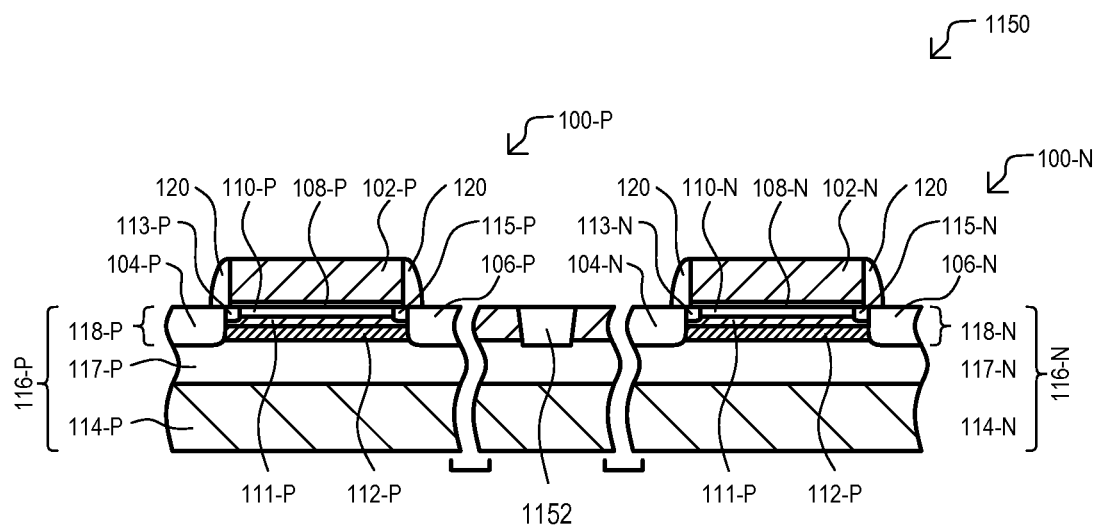
FIG. 11 is a side cross sectional view of a semiconductor structure having a channel stack with n-type and p-type transistor elements.

FIG. 11 is a side cross sectional view of a semiconductor structure 1150 having a channel stack according to an embodiment. A structure 1150 can include one or more p-type transistor elements (one shown as 100-P) as well as one or more n-type transistor elements (one shown as 100-N). Transistor elements (100-N and 100-P) can have structures like those shown in FIG. 1, or equivalents, with doping types suitable for the conductivity type of the transistor. Like items to those of FIG. 1 are shown with the same reference character but with the "-N" or "-P" indicating transistor conductivity type. Substantially undoped channels 110-N and 110-P can be formed from a common layer, such as a same epitaxial layer. An isolation region 1152 can separate n-type element 100-N from p-type element 100-P.

As will be understood, wafers and die supporting multiple transistor types, including those with and without the described dopant layers and structures are contemplated. Electronic devices that include the disclosed transistor structures or are manufactured in accordance with the disclosed processes can incorporate die configured to operate as "systems on a chip" (SoC), advanced microprocessors, radio frequency, memory, and other die with one or more digital and analog transistor configurations, and are capable of supporting a wide range of applications, including wireless telephones, communication devices, "smart phones", embedded computers, portable computers, personal computers, servers, and other electronic devices. Electronic devices can optionally include both conventional transistors and transistors as disclosed, either on the same die or connected to other die via motherboard, electrical or optical interconnect, stacking or through used of 3D wafer bonding or packaging. According to the methods and processes discussed herein, a system having a variety of combinations of analog and/or digital transistor devices, channel lengths, and strain or other structures can be produced.

Although the present disclosure has been described in detail with reference to a particular embodiment, it should be understood that various other changes, substitutions, and alterations may be made hereto without departing from the spirit and scope of the appended claims. Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A field effect transistor having a source, drain, and a gate, comprising:
   a semiconductor substrate, a buried insulator layer positioned on the semiconductor substrate, and a semiconductor overlayer positioned on the buried insulator layer;
   a low dopant channel region positioned below the gate and between the source and the drain, the low-dopant channel region being further positioned in an upper portion of the semiconductor overlayer; and
   a plurality of doped regions having a predetermined dopant concentration profile, the plurality of doped regions including a screening region, with the screening region positioned in the semiconductor overlayer below the low dopant channel region, the screening region extending toward the buried insulator layer, the plurality of doped regions further including a threshold voltage set region positioned between the screening region and the low dopant channel, the screening region and the threshold voltage set region having each a peak dopant concentration, the threshold voltage region peak dopant concentration being between $1/50$ and $1/2$ of the peak dopant concentration of the screening region.

2. The field effect transistor of claim 1, wherein buried insulator layer is a buried oxide layer.

3. The field effect transistor of claim 1, wherein the peak dopant concentration of the screening region is at least $5 \times 10^{18}$ atoms/cm$^3$.

4. The field effect transistor of claim 1, wherein the screening region extends within 5 nm of the buried insulator layer.

5. The field effect transistor of claim 1, wherein the threshold voltage set region extends within 30 nm of the buried insulator layer.

6. The field effect transistor of claim 1, further including a bias tap coupled to the screening region, wherein the bias tap is configured to adjust a threshold voltage of the field effect transistor by application of a bias voltage.

7. The field effect transistor of claim 1, wherein at least the semiconductor overlayer comprises silicon.

8. A field effect transistor having a source, a drain, and a gate, comprising:
   a substrate including a semiconductor substrate, a buried insulator layer positioned on the semiconductor substrate, and a semiconductor overlayer positioned on the buried insulator layer;
   a low dopant channel region positioned below the gate and between the source and the drain, the low-dopant channel region being further positioned in an upper portion of the semiconductor overlayer;
   a screening region positioned in the semiconductor overlayer below the low dopant channel region and above the buried insulator layer; and
   a threshold voltage set region positioned between the screening region and the low dopant channel,
   wherein the screening region and the threshold voltage set region are formed by separate dopant implants so that the screening region and the threshold voltage are proximate to and distinct from one another.

9. The field effect transistor of claim 8, wherein the screening region has a peak dopant concentration, the peak dopant concentration being above the buried insulator layer.

10. The field effect transistor of claim 9, wherein the threshold voltage set region has a doping concentration between $1/50$ to $1/2$ of the peak dopant concentration.

11. The field effect transistor of claim 9, wherein the peak dopant concentration is at least $1 \times 10^{19}$ atoms/cm$^3$.

12. The field effect transistor of claim 8, wherein the threshold voltage set region extends within 30 nm of the buried insulator layer.

13. The field effect transistor of claim 8, further comprising a ground plane positioned below the buried insulator layer.

14. The field effect transistor of claim 8, wherein the threshold voltage set region has less than 20 percent of the dopants in a predetermined dopant concentration profile.

15. The field effect transistor of claim 8, further comprising a bias tap coupled to the screening region, the bias tap configured to adjust a threshold voltage of the field effect transistor by application of a bias voltage.

* * * * *